(12) United States Patent
Flewitt

(10) Patent No.: US 6,483,124 B2
(45) Date of Patent: Nov. 19, 2002

(54) THIN FILM TRANSISTORS AND THEIR MANUFACTURE

(75) Inventor: Andrew J. Flewitt, Cambridge (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/134,922

(22) Filed: Apr. 29, 2002

(65) Prior Publication Data

US 2002/0119590 A1 Aug. 29, 2002

Related U.S. Application Data

(62) Division of application No. 09/881,601, filed on Jun. 14, 2001, now Pat. No. 6,410,372.

(30) Foreign Application Priority Data

Jul. 18, 2000 (GB) .............................................. 0017471

(51) Int. Cl.⁷ ....................... H01L 29/04; H01L 31/036; H01L 31/0376; H01L 31/20
(52) U.S. Cl. ............................ 257/59; 257/57; 257/72; 257/347; 257/350
(58) Field of Search ............................. 257/57, 59, 66, 257/72, 347, 358

(56) References Cited

U.S. PATENT DOCUMENTS

| | | | |
|---|---|---|---|
| 5,340,999 A | * 8/1994 | Takeda et al. | ................. 257/66 |
| 6,166,399 A | * 12/2000 | Zhang et al. | .................. 257/72 |
| 6,242,758 B1 | * 6/2001 | Yamazaki et al. | ............. 257/59 |
| 6,437,366 B1 | * 8/2002 | Takemura | ..................... 257/51 |

* cited by examiner

Primary Examiner—Ngân V. Ngô

(57) ABSTRACT

A method of manufacturing a bottom gate transistor comprises depositing a first microcrystalline silicon layer (40) over the gate insulator layer (22a) and exposing the microcrystalline silicon layer to a nitrogen plasma (42), thereby forming silicon nitride with a crystalline structure. A plurality of microcrystalline silicon nitride layers are formed in this way. A further microcrystalline silicon layer is deposited over the exposed layers defining the semiconductor body (14) of the transistor. This method enables the bottom of the transistor body to have a microcrystalline structure, improving the mobility of the semiconductor layer, even at the interface with the gate insulator layer. The exposed silicon nitride layers become part of the gate insulator layer, and there is improved structural matching between the gate insulator layer and the semiconductor transistor body, which layers derive from the same microcrystalline silicon structure.

5 Claims, 3 Drawing Sheets

THIN FILM TRANSISTORS AND THEIR MANUFACTURE

CROSS REFERENCE TO RELATED APPLICATIONS

This is a divisional of application Ser. No. 09/881,601, filed Jun. 14, 2001, now U.S. Pat. No. 6,410,372.

This invention relates to thin film transistors, for example for forming the transistor substrate used in the manufacture of liquid crystal displays.

BACKGROUND AND SUMMARY OF THE INVENTION

There is much interest in improving arrays of TFTs which are used to form the switching elements for flat panel liquid crystal displays. These TFT devices may be fabricated with portions of an amorphous, polycrystalline or microcrystalline semi-conductor film to form the body of the transistor devices.

Hydrogenated amorphous silicon is currently used as the active layer in thin film transistors (TFTs) for active matrix liquid crystal displays. This is because it can be deposited in thin, uniform layers over large areas by plasma enhanced chemical vapour deposition (PECVD). However, due to its amorphous structure, it has a very low carrier mobility, which reduces the switching speed of devices and prevents the use of these transistors in display driver circuitry. Amorphous silicon TFTs are also relatively unstable and are useful for display applications only because the duty cycle is relatively low.

Crystalline silicon is required for the higher speed driver circuitry, which necessitates both a driving circuit panel and a display panel within a display device, with interconnections between these two circuit types.

It has been recognised that microcrystalline silicon may offer a solution to these problems because transistors having microcrystalline silicon as the active layer have improved carrier mobility and yet can still be deposited using a PECVD process. Microcrystalline silicon films deposited in this way consist of small crystals, for example up to 100 nm, embedded within an amorphous matrix. If the crystal grains are large enough, then extended state conduction is enhanced and the mobility increased, approximately by a factor of 10 compared to amorphous silicon layers.

However, deposition by PECVD tends to result in grains being produced with a conical structure. This results in the lower 5–10 nm of material being predominantly amorphous. In a bottom gate TFT structure, the bottom part of the silicon film defines the boundary between the gate insulator and silicon body of the transistor. Therefore, in a bottom gate TFT structure the advantage of the crystalline material is largely lost, whereas top gate TFT structures do exhibit improved mobility and significantly improved stability. These improvements in performance have not been achieved for bottom gate structures for the reasons above.

According to a first aspect of the present invention, there is provided a method of manufacturing a transistor, comprising:

(i) defining a gate conductor over an insulating substrate;

(ii) forming a gate insulator layer over the gate conductor;

(iii) depositing a first microcrystalline silicon layer over the gate insulator layer;

(iv) exposing the microcrystalline silicon layer to a nitrogen plasma, thereby forming silicon nitride, and substantially maintaining the crystalline structure;

(v) repeating steps (iii) and (iv) for a plurality of microcrystalline silicon layers;

(vi) forming a further microcrystalline silicon layer over the exposed layers, the further layer defining the semiconductor body of the transistor; and (vi) defining a source and drain structure over the transistor body.

This method enables the bottom of the transistor body to have a microcrystalline structure, improving the mobility of the semiconductor layer, even at the interface with the gate insulator layer. The exposed layers which form silicon nitride become part of the gate insulator layer, and there is improved structural matching between the gate insulator layer and the semiconductor transistor body, which layers derive from the same microcrystalline silicon structure.

The microcrystalline silicon layer deposited in steps (iii) and (vi) may be formed by a PECVD process, and the plurality of layers deposited in these steps typically have a combined thickness of between 5 and 25 nm. The individual layers deposited may each have a thickness of between 0.5 and 2 nm.

The exposure in step (iv) is preferably exposure to a dense nitrogen plasma produced by electron cyclotron resonance PECVD.

According to a second aspect of the invention, there is provided a bottom gate thin film transistor comprising:

a gate conductor disposed over an insulating substrate;

a gate insulator layer over the gate conductor;

a silicon nitride layer over the gate insulator layer, the silicon nitride layer having a substantially crystallised structure at the top of the layer, and a substantially amorphous structure at the bottom of the layer;

a microcrystalline silicon layer over the silicon nitride layer which defines the semiconductor body of the transistor; and a source and drain structure over the transistor body.

The crystal structure within the silicon nitride layer enables the semiconductor body of the transistor to have the desired microcrystalline structure throughout the thickness of the layer, and particularly at the semiconductor/insulator interface.

A thin film transistor active plate for an active matrix liquid crystal display may use transistors of the invention

BRIEF DESCRIPTION OF THE DRAWING FIGURES

The invention will now be described by way of example with reference to the accompanying drawings, in which.

Figure 1:
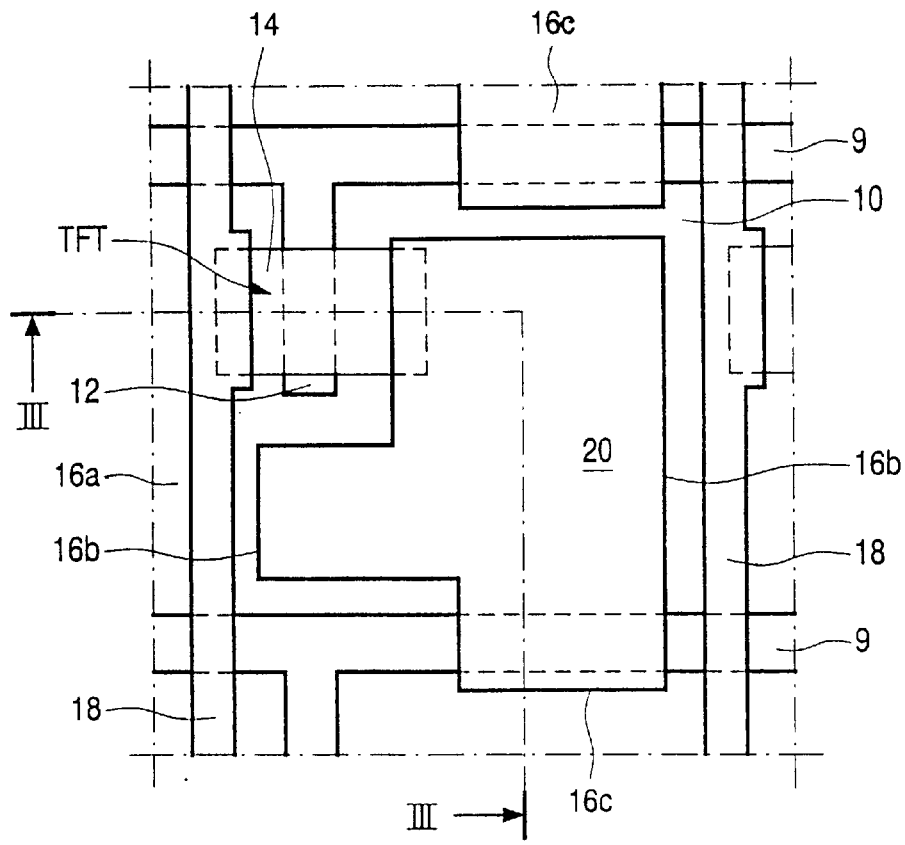
FIG. 1 shows in plan view a pixel of a liquid crystal display device incorporating a transistor-capacitor arrangement using a bottom gate transistor.

It should be noted that these figures are diagrammatic and not drawn to scale. Relative dimensions and proportions of parts of these figures have been shown exaggerated or reduced in size, for the sake of clarity and convenience in the drawings.

DETAILED DESCRIPTION

Transistor substrates according to the invention, and manufactured in accordance with the invention, form the switching elements of a liquid crystal display device. By way of example, FIG. 1 shows the whole area of one pixel of an active matrix display device using bottom gate transistors, to which the invention may be applied. A pixel comprises an electrode pattern 9 formed on an insulating substrate 10. The substrate 10 may comprise a back plate of the display, for example a glass plate or polymer film.

The electrode pattern 9 defines the row conductors of the matrix array, and also defines the gate electrode 12 of the switching transistor TFT. The semiconductor transistor body 14 overlies the gate electrode, spaced by a gate insulator. An upper electrode layer 16a, 16b defines the source and drain electrodes of the transistor TFT, which are connected to a column electrode 18 and a connector pad 20 for the liquid crystal material, respectively.

The column conductors 18 are defined by part 16a of the upper electrode layer, and these column.conductors 18 define the source electrodes of the TFTs. Part 16b of the upper electrode layer forms a drain electrode of the TFT and also forms the bulk of the upper electrode layer, forming a pixel electrode 20. This pixel electrode 20 is integral with the drain electrode and also, in this example, with a part 16c which forms the top electrode of a pixel storage-capacitor, the bottom electrode being defined by a row conductor 9 of a neighbouring pixel.

The switching TFT of each cell comprises a silicon transistor body 14. The invention is concerned specifically with the structure and processing of transistor body and the gate insulator layer, as will be described further below.

Liquid crystal material is provided over the transistor substrate, the components of which are shown in FIG. 1. Above the liquid crystal material, an additional substrate is provided defining a ground plane, as will be described with reference to FIG. 3.

Figure 2:
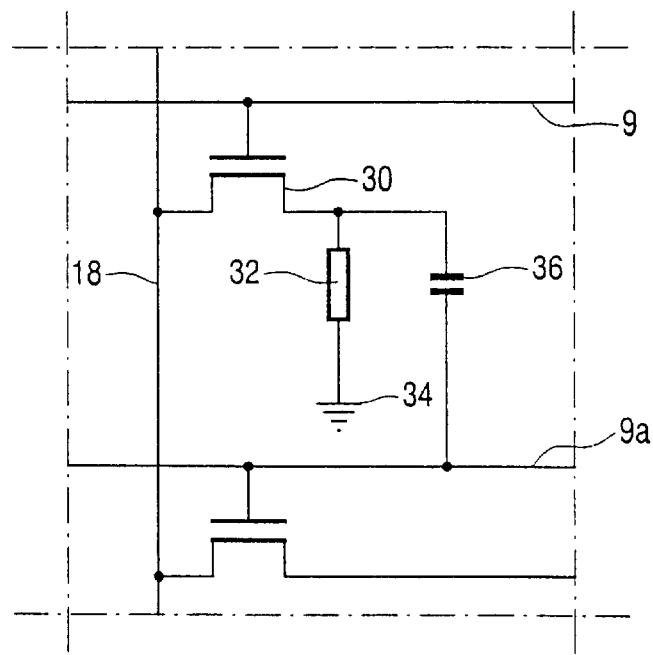
FIG. 2 illustrates the components of a liquid crystal display pixel, for explaining the operation of the display device.

FIG. 2 shows the electrical components which make up the pixels shown in FIG. 1. The row conductor 9 is connected to the gate of the TFT 30, and the column electrode 18 is coupled to the source electrode, as explained with reference to FIG. 1. The liquid crystal material provided over the pixel effectively defines a liquid crystal cell 32 which extends between the drain of the transistor 30 and a common ground plane 34. The pixel storage capacitor 36 is connected between the drain of the transistor 30 and the row conductor 9a associated with the next row of pixels.

During operation of the display device, signals are applied to rows of pixels in turn. In order to address a row of pixels, an appropriate signal is applied to the associated row conductor 9 to turn on the transistors 30 of the row of pixels. This enables a display signal applied to the column conductor 18 to be fed to the liquid crystal cell 32, which results in charging of the liquid crystal cell to the desired voltage. The storage capacitor 36 is also charged and is provided to ensure that the signal on the liquid crystal cell 32 remains constant even after the addressing of that particular row has been completed, and the transistors 30 have been turned off. During addressing of the row of pixels, the row conductor 9a of the subsequent row of pixels is held at ground potential so that the storage capacitor 36 is charged to a voltage corresponding to that which is to be applied across the liquid crystal cell 32.

When the next row of pixels is addressed, there will be an increase in the voltage of the row conductor 9a, which will feed through the capacitor 36 by capacitive coupling to the liquid crystal cell 32. However, this increased voltage on the next row conductor 9a only lasts for one row address period, after which that row conductor 9a returns to ground. The liquid crystal material has slower response time and does not respond to these instantaneous voltage changes.

Figure 3:
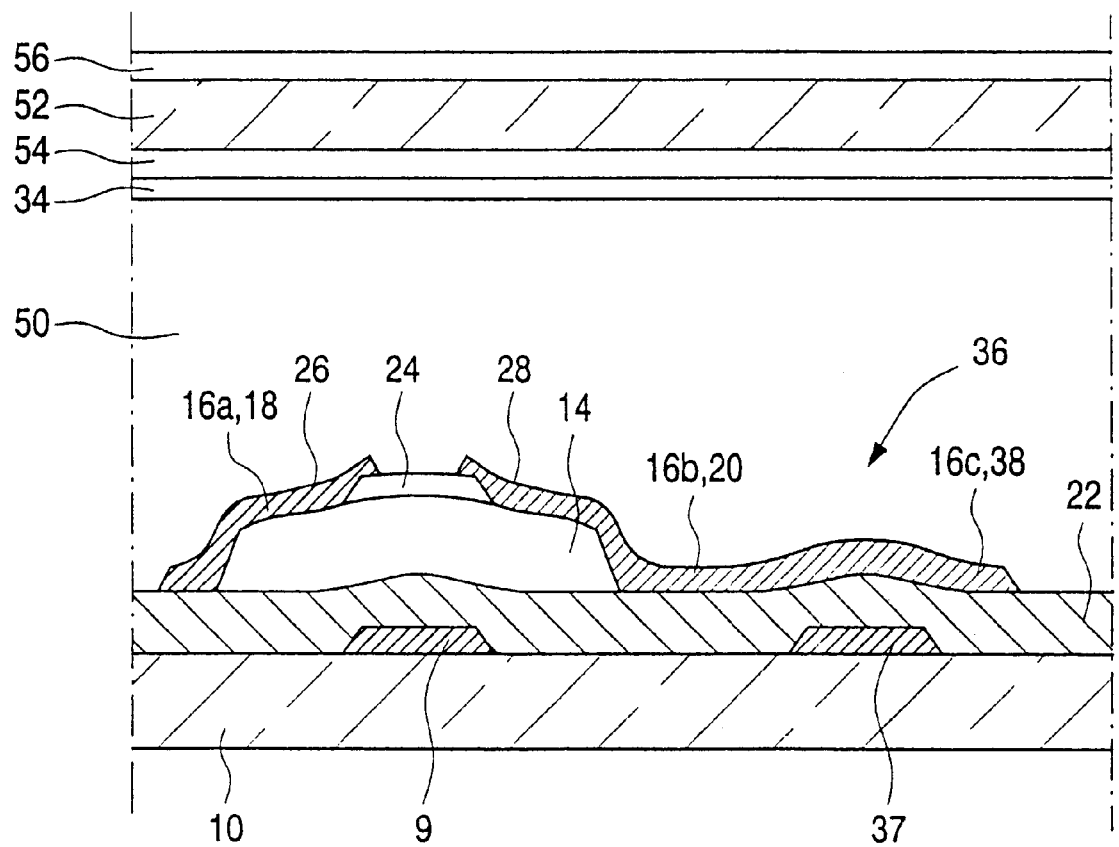
FIG. 3 shows a liquid crystal display using a transistor substrate having transistors manufactured according to the invention.

FIG. 3 shows in cross section (line III—III of FIG. 1) a transistor substrate for use within a liquid crystal display.

A gate electrode pattern 9 is provided on the substrate 10, and also defines the lower terminal 37 of the storage capacitor 36. The gate of the transistor forms part of the respective row conductor, and the lower terminal 37 of the storage capacitor 36 forms part of the row conductor for the next adjacent row of pixels.

To define the pattern 9, a conductor layer may be deposited on a glass substrate 10, and wet etching may be performed in order to define the conducting pattern.

A gate dielectric layer 22 is then deposited. This layer 22 extends beyond the body of the transistor, and defines the dielectric layer for the storage capacitor 36.

The silicon layer 14 forming the body of the transistor is deposited over the gate insulator layer. The invention is concerned specifically with the processing of the gate insulator layer and the deposition of the silicon layer 14, as will be described below.

An etch stop plug 24 is patterned overlying and aligned with the gate 9, and an n+ contact layer overlies the transistor body, over which the source and drain electrodes 26,28 are then deposited. The layer 16 defining the source and drain electrodes also defines the top contact 38 of the storage capacitor 36. The source 26 forms part of a respective column conductor 18, and the drain 28 is integral with the liquid crystal contact pad 20 as well as the top contact 38 of the storage capacitor 36. Of course, additional layers to those described may be desired, for example planarising layers.

These layers complete the transistor substrate for the liquid crystal display. A layer of liquid crystal material 50 is provided over the transistor substrate, and a further substrate 52 overlies the layer of liquid crystal material. This further substrate 52 may be provided on one face with an arrangement of colour filters 54 and a plate defining the common electrode 34. A polarising plate 56 is provided on the opposite side of the substrate 52.

The liquid crystal display structure is known to the extent described above. One commonly used insulator for the gate insulator layer 22 is silicon nitride, which also can be deposited by a PECVD process. It has been shown, for example in the article of W N Singer et al in Appl. Phys. Lett. 72,1164,1998, that a 25 nm thick layer of silicon nitride can be produced on a crystalline silicon wafer by exposure to a dense nitrogen plasma produced by electron cyclotron resonance (ECR) PECVD. In order to implant nitrogen atoms to such a depth, a high substrate bias has to be used.

The invention is based on the recognition that this conversion of the silicon layer into silicon nitride can be used to obtain improved crystallization of the silicon body of the transistor particularly at the base of the silicon layer. In particular, a layer-by-layer deposition technique is used to convert the lower amorphous layer of a microcrystalline silicon sample into a silicon nitride layer which then forms part of the gate insulator layer within a bottom gate TFT.

FIG. 4 shows the processing steps provided by the invention and which form part of the overall transistor manufacturing process.

Figure 4A:
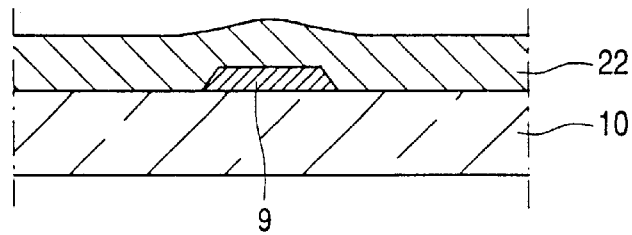
FIG. 4 shows the manufacturing steps of the invention for forming a bottom gate microcrystalline TFT.
Figure 4B:
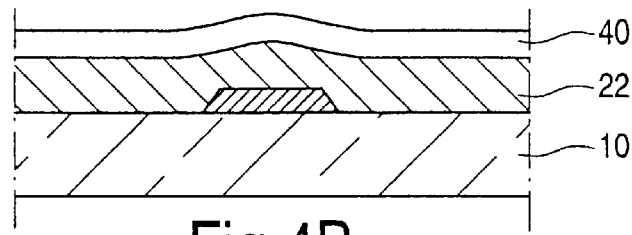
Figure 4C:
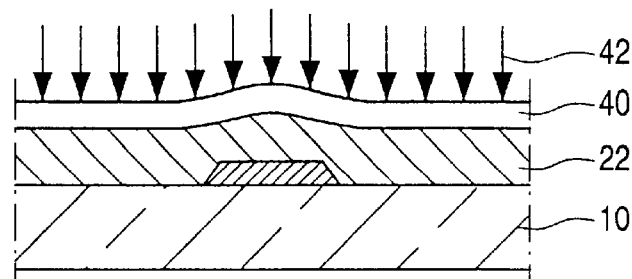

FIG. 4a shows the substrate 10 already provided with the patterned gate electrode layer 9 and a silicon nitride gate insulator layer 22. Initially, a thin microcrystalline silicon layer 40 is deposited by a PECVD process (FIG. 4b). This layer 40 preferably has a thickness of between 0.5 nm and 2 nm. As shown in FIG. 4c, this layer is exposed to a dense nitrogen plasma containing a significant population of atomic nitrogen ions, represented by arrows 42, for example such as produced by ECR-PECVD, very high frequency RF-PECVD or any other appropriate technique. With a suitably low ion energy, the microcrystalline silicon layer will be converted into silicon nitride, while preserving any crystalline structures in the layer. This ion energy is likely to be in the range 0–100 eV and, in the case of ECR-PECVD, it may be defined though application of an rf bias to the substrate.

Figure 4D:
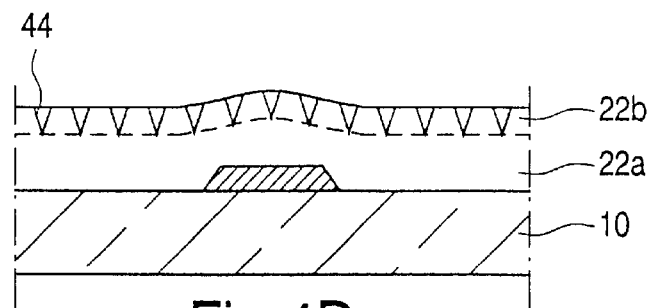

Further thin layers of microcrystalline silicon are deposited and treated with the dense nitrogen plasma, so that a layer-by-layer process is produced. This process is repeated until the top surface is predominantly crystalline. The thickness of the combined layers is likely to be of the order of 10 nm. As shown in FIG. 4d, the resulting gate insulator layer comprises a base part 22a and a top part 22b derived from the layer-by-layer process. The symbols 44 in FIG. 4d are intended to represent schematically how the state of crystallization increases towards the top of the gate insulator layer 22a, 22b as a result of the conical grain structure of microcrystalline silicon deposited by PECVD.

A further layer of microcrystalline silicon is then deposited to define the body 14 of the transistor.

This process provides an improved crystalline structure of the microcrystalline transistor body, particularly at the semiconductor-gate insulator interface. This gives rise to improved carrier mobility. Furthermore, the mechanical interface between the layers 22 and 14 will be improved as a result of the excellent structural match between these layers.

Figure 4E:
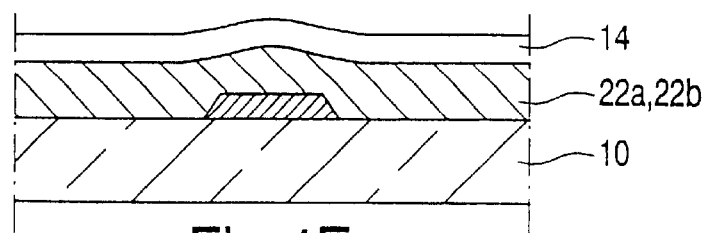

Conventional techniques can be used to define the source and drain structure over the insulated gate structure shown in FIG. 4e as well as for the liquid crystal layer and associated further substrate 52. These processes will therefore not be described in detail in this application.

In the preferred example described, the gate insulator layer 22 comprises silicon nitride, so that the additional gate insulator layers resulting from the nitrogen plasma have the same structure as the underlying insulator layer, although in partly crystallized form. However, the lower gate insulator layer 22a does not necessarily need to be silicon nitride.

The transistor of the invention has been described as used to form the active plate of a liquid crystal display. However, the transistor of the invention may equally be applied to other devices, and in particular to any existing integrated circuit devices using amorphous silicon transistors. The invention enables bottom gate transistors to be manufactured using chemical vapour deposition processes whilst giving improved transistor performance resulting from increased carrier mobility within the silicon transistor channel.

Various modifications to the specific layers used in the manufacture of the TFT substrate will be apparent to those skilled in the art, which do not prohibit the use of the invention in those transistor substrates.

What is claimed is:

1. A bottom gate thin film transistor comprising:
   a gate conductor disposed over an insulating substrate;
   a gate insulator layer over the gate conductor;
   a silicon nitride layer over the gate insulator layer, the silicon nitride layer having a substantially crystallized structure at the top of the layer, and a substantially amorphous structure at the bottom of the layer;
   a microcrystalline silicon layer over the silicon nitride layer which defines the semiconductor body of the transistor; and
   a source and drain structure over the transistor body.

2. A transistor as claimed in claim 1, wherein the gate insulator layer comprises silicon nitride.

3. A transistor as claimed in claim 1 or 2, wherein the silicon nitride layer over the gate insulator layer has a thickness of between 5 and 25 nm.

4. A thin film transistor active plate for an active matrix liquid crystal display, comprising transistors as claimed in claim 1, 2 or 3.

5. A liquid crystal display comprising a thin film active plate as claimed in claim 1, and a liquid crystal layer provided over the active plate.

* * * * *